United States Patent

Ono et al.

[15] 3,645,807

[45] Feb. 29, 1972

[54] METHOD FOR MANUFACTURING A SEMICONDUCTOR DEVICE

[72] Inventors: Minoru Ono, Kodaira-shi; Toshimitu Momoi, Tokyo, both of Japan

[73] Assignee: Hitachi, Ltd., Tokyo, Japan

[22] Filed: Dec. 21, 1967

[21] Appl. No.: 692,547

[30] Foreign Application Priority Data

Dec. 26, 1966 Japan....................................41/84435

[52] U.S. Cl...................................148/187, 156/17, 156/11, 117/215, 117/63, 29/578

[51] Int. Cl...........................................H01l 7/50, H01l 7/44

[58] Field of Search .................156/17, 13, 11; 148/175, 1.5; 117/200, 212; 29/578

[56] References Cited

UNITED STATES PATENTS 3,385,729 5/1968 Larchian...............................117/200
3,438,873 4/1969 Schmidt...................................204/35
3,326,729 6/1967 Sigler....................................148/175

OTHER PUBLICATIONS

Chemical Abstracts Vol. 65, 1966 p. 16208 g. $Si_3N_4$, a New Diffusion Mask.

*Primary Examiner*—Jacob H. Steinberg
*Attorney*—Craig, Antonelli & Hill

[57] ABSTRACT

A method for forming a silicon nitride film on the surface of a semiconductor substrate in the following way. A silicon oxide film is formed on a prescribed portion of the surface of the semiconductor substrate. A silicon nitride film is deposited to cover the surfaces of the silicon oxide film and of the semiconductor substrate. At least one portion of the silicon nitride film deposited on the silicon oxide film is removed. The silicon oxide film in this portion is removed from the surface of the semiconductor substrate. Thus, a silicon nitride film having a prescribed pattern is formed on the surface of the semiconductor substrate.

7 Claims, 8 Drawing Figures

INVENTORS
MINORU ONO
TOSHIMITU MOMOI

BY Craig & Antonelli
ATTORNEYS

METHOD FOR MANUFACTURING A SEMICONDUCTOR DEVICE

BACKGROUND OF THE INVENTION

1. Field of the Invention

This invention relates to a method for manufacturing a semiconductor device, and more particularly to a method for selectively forming a passivation film on the semiconductor surface.

In a semiconductor device such as a transistor and a diode, the surface of the semiconductor substrate is coated with a passivation film, e.g., a silicon oxide film, to isolate the surface from the external atmosphere. The silicon oxide film is partially removed or reformed during the manufacturing process. For example, when an impurity is selectively diffused in a desired portion of the surface of the semiconductor substrate, the silicon oxide film serves as a diffusion mask. However, as the silicon oxide film does not become a mask against Ga, Zn, Al, and $O_2$, the diffusion impurity is necessarily limited to particular impurities.

2. Description of the Prior Art

Recently, the use of silicon nitride film has been proposed in place of silicon oxide film after various investigations. The silicon nitride film is advantageous in that it becomes a mask against such important impurities as are not masked by a silicon oxide film. The silicon nitride film is obtained by the reaction of monosilane ($SiH_4$) and ammonium ($NH_3$) in a deoxidizing atmosphere and is considered to be $Si_3N_4$. Its high melting point (about 1,900° C.) is suitable for high temperature treatment. So, $Si_3N_4$ can act as an effective mask when an impurity is selectively diffused. Further, this film is stable and excellent if used as a passivation film for a semiconductor surface.

On the other hand, etching of a silicon nitride film is extremely difficult. This defect cancels the aforementioned advantages. Since the silicon nitride film is scarcely etched by an etching solution containing fluoric acid as a major ingredient, its use as a mask for selective diffusion in a desired form is difficult.

SUMMARY OF THE INVENTION

This invention solves the above-mentioned defect. The main purpose thereof is to provide a method of forming a substrate whose surface is covered with a thin film having a desired pattern.

Another object of this invention is to provide a method of forming a substrate whose surface is covered with a silicon nitride film having a desired pattern.

A further object of this invention is to provide a semiconductor device covered with a stable passivation film of silicon nitride.

Still another object of this invention is to provide a semiconductor device having a passivation film of a desired material on a desired portion of the surface thereof.

Another object of this invention is to provide a method of forming a silicon nitride mask to diffuse selectively an impurity in a silicon substrate.

According to this invention, when one wants to form a silicon nitride film on a desired portion of the surface of a semiconductor substrate, a thin film of another material is prepared and formed on the surface excepting the desired portion. Next, a silicon nitride film is uniformly formed on the whole surface. Thereafter the thin oxide film and the silicon nitride film lying thereon are removed.

A concrete method of this invention accomplishing above objects will be made apparent with reference to the following embodiments and accompanying drawings.

DESCRIPTION OF THE PREFERRED EMBODIMENTS

One embodiment of this invention will be explained hereinafter with reference to FIGS. 1*a* through 1*d*.

Figure 1A:
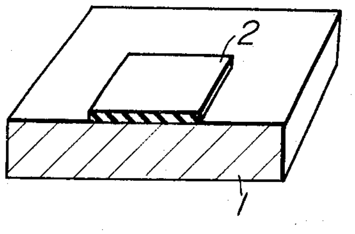
FIGS. 1*a* through 1*d* are perspective cross-sectional views of a semiconductor element in each manufacturing process according to one embodiment of this invention.

FIG. 1*a*: A silicon substrate 1, a prescribed portion of which is covered with a silicon oxide film 2, is prepared in the following way. The silicon substrate 1 is heated in an oxidizing atmosphere at about 1,100° C. for an hour to form on one surface thereof a silicon oxide film 2 of about 5,000 A. thickness. By applying the conventional photoetching technique the film 2 is selectively removed. Thus, a semiconductor element as shown in FIG. 1*a* is prepared.

The silicon oxide film 2 may be obtained by another method, i.e., by thermally decomposing an organic silane at a relatively low temperature and depositing the resulting silicon oxide on the surface of substrate 1.

Figure 1B:
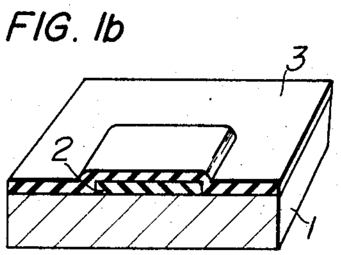

FIG. 1*b*: A silicon nitride film 3 is deposited on the whole surface of a silicon substrate including the surface of silicon oxide film 2. This is done by the reaction of monosilane ($SiH_4$) and ammonium ($NH_3$) in a deoxidizing atmosphere. For example, three minutes reaction at 900° C. gave 1,000 A. thickness to the silicon nitride film. The silicon nitride film deposited on the silicon oxide film 2 is shown swollen or exaggerated.

Figure 1C:
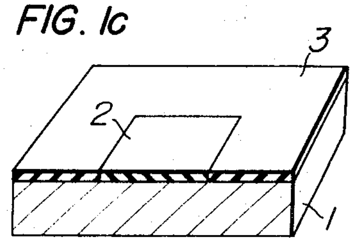

FIG. 1*c*: The surface of substrate 1 is polished by alumina ($Al_2O_3$) powder, removing the silicon nitride film at least at the swollen portion. The surface of silicon oxide film 2 is thus exposed as shown in FIG. 1*c*. It is preferable with a view to polishing to form the silicon oxide film 2 thicker than the silicon nitride film 3.

Figure 1D:
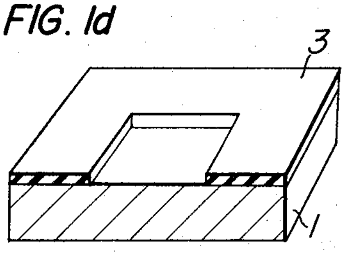

FIG. 1*d*: The silicon substrate 1 is dipped into a solution containing fluoric acid as a major ingredient, thereby removing the silicon oxide film 2. The silicon nitride film 3 remains, unaffected by etching and preserves the prescribed pattern. It is apparent that the silicon nitride film can act as a diffusion mask and a passivation film of semiconductor substrate.

Another embodiment of this invention is shown in FIGS. 2*a* through 2*d*.

Figure 2A:
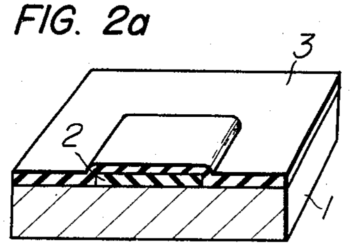
FIGS. 2*a* through 2*d* are perspective cross-sectional views of a semiconductor element in each manufacturing process according to another embodiment of this invention.
Figure 2B:
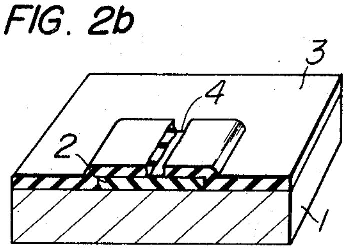
Figure 2C:
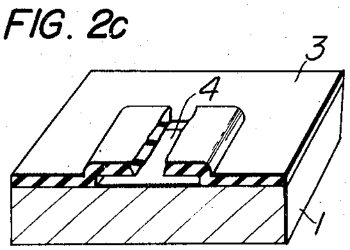
Figure 2D:
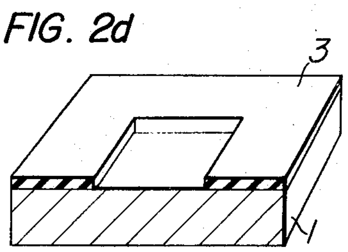

A nitride film 3 of about 3,000 A. thickness is deposited on the whole surface of silicon substrate 1 partially covered with an oxide film 2 of about 1 $\mu$ thickness, as shown in FIG. 2*a*. A groove 4 is formed in the nitride film 3 as shown in FIG. 2*b*, thereby exposing at least one portion of the oxide film 2. A hole may be formed instead of the groove 4. The formation of a groove or a hole is made by a mechanical method, e.g., by scribing with use of a cutter as seen in the manufacturing process of a semiconductor device. Next, the substrate 1 is dipped in an etching solution containing fluoric acid as a major ingredient. The etching solution reacts with the oxide film 2 through the groove 4 or the hole, and the oxide film 2 is removed as shown in FIG. 2*c*. The nitride film lying on the oxide film 2 is removed mechanically, e.g., by scraping. Thus, a silicon nitride film having a prescribed pattern is formed on the substrate as shown in FIG. 2*d*. When the depositions of oxide and nitride films are made relatively thick and thin respectively, cracks are liable to appear in the nitride film 3 lying on the oxide film 2, the thermal expansion coefficient of nitride film being larger. These cracks may be utilized for the exposure of silicon oxide film in place of the groove 4 shown in FIG. 2*b*. The substrate is thereafter subjected to an etching treatment.

According to this invention, therefore, a first thin film is formed arbitrarily on the surface of the substrate of an arbitrary material and a second thin film is formed on the surfaces of the substrate and the first thin film. The first thin film is exposed and thereafter the substrate is dipped in an etching solution to remove only the first thin film. Thus, a desired pattern of the second thin film is obtained on the substrate. Although in the foregoing embodiments oxide and nitride films are used as the first and the second thin film respectively, it does not depart from the scope of this invention to use other arbitrary materials.

Therefore, this invention makes it possible to form a thin film of desired material on a substrate in accordance with a desired pattern. Many other applications of this invention are possible, e.g., the manufacturing process of a semiconductor device as well as its application to a diffusion mark. The nitride film, if used as a diffusion mask, has the advantage that it masks Ga, Al, Zn, and $O_2$ which an oxide film could not mask. Moreover, since the nitride film stably acts as a passivation film, it can be left on the surface of the substrate.

The thicknesses of the oxide and the nitride films, i.e., the first and second passivation films, may be chosen arbitrarily, and hence a semiconductor device having a desired characteristic may be obtained.

What is claimed is

1. A method for manufacturing a semiconductor device comprising the steps of:

covering a prescribed portion of a surface of a semiconductor substrate with a silicon oxide film, depositing a silicon nitride film on the whole surface of said substrate including the surface of said silicon oxide film from vapor phase, polishing the surface of said silicon nitride film formed on said silicon oxide film with alumina powder to remove the silicon nitride film on the silicon oxide film and expose said silicon oxide film, dipping the thus produced substrate into an etchant containing hydrofluoric acid as a major ingredient thereof to remove said silicon oxide film and to form a hole corresponding to the shape and size of said silicon oxide film in said silicon nitride film, and selectively diffusing an impurity into said substrate through the hole formed in said silicon nitride film.

2. A method for manufacturing a semiconductor device comprising the steps of: forming a silicon oxide film on a surface of a semiconductor substrate; selectively etching said silicon oxide film to selectively expose the surface of said substrate; depositing a silicon nitride film from vapor phase on said silicon oxide film and on the exposed surface of said substrate; removing at least a portion of said silicon nitride film formed on said silicon oxide film to expose at least a portion of said silicon oxide film; and dipping the thus produced substrate into an etchant containing hydrofluoric acid as a major ingredient thereof to remove said silicon oxide film and to form a hole corresponding to the shape and size of said silicon oxide film in said silicon nitride film.

3. A method for manufacturing a semiconductor device according to claim 10, wherein said silicon oxide film is thicker than said silicon nitride film.

4. A method according to claim 2, wherein said silicon nitride film formed on said silicon oxide film is partially removed by forming an aperture in said silicon nitride film and the portion of said silicon nitride film which remains on said silicon oxide film is mechanically removed after said oxide film is removed.

5. A method for forming on a semiconductor substrate a thin film having a prescribed pattern comprising the steps of:

a. preparing a semiconductor substrate having a silicon oxide film on a prescribed portion of the surface thereof;
b. depositing a silicon nitride film on the surface of said silicon oxide film and on the portion of said semiconductor substrate not covered by said silicon oxide film, said silicon nitride film being not thicker than said silicon oxide film;
c. removing at least a portion of said silicon nitride film to expose at least a portion of said silicon oxide film;
d. dipping said semiconductor substrate covered with said silicon oxide and silicon nitride films into an etchant containing HF as a major ingredient, whereby said silicon oxide film is removed and at the same time a hole corresponding to the shape and size of said silicon oxide film is formed in said silicon nitride film.

6. A method for manufacturing a semiconductor substrate having a film of a prescribed pattern on the surface thereof, comprising the steps of:

a. preparing a planar silicon semiconductor substrate containing on the surface thereof a silicon dioxide film having a pattern in inverse relation to said film of the prescribed pattern;
b. depositing from vapor phase a material to form a silicon nitride film covering the surface of said silicon dioxide film and the surface of said silicon semiconductor substrate not covered by said silicon dioxide film, said silicon nitride film being not thicker than said silicon dioxide film;
c. mechanically removing at least a portion of said silicon nitride film to expose said silicon dioxide film, and
d. dipping said silicon semiconductor substrate into an etching solution containing HF as a major ingredient whereby said silicon dioxide film is removed and at the same time a hole corresponding to the shape and size of said silicon dioxide film is formed in said silicon nitride film.

7. A method according to claim 6, wherein said silicon dioxide and silicon nitride films are 1 $\mu$ thick and 3,000 A. thick, respectively.

* * * * *